(12) United States Patent  
Niemann

(10) Patent No.: US 9,335,364 B2  
(45) Date of Patent: May 10, 2016

(54) SMU RF TRANSISTOR STABILITY ARRANGEMENT

(71) Applicant: Keithley Instruments, Inc., Cleveland, OH (US)

(72) Inventor: James A. Niemann, Chagrin Falls, OH (US)

(73) Assignee: KEITHLEY INSTRUMENTS, INC., Cleveland, OH (US)

( * ) Notice: Subject to any disclaimer, the term of this patent is extended or adjusted under 35 U.S.C. 154(b) by 339 days.

(21) Appl. No.: 13/901,430

(22) Filed: May 23, 2013

(65) Prior Publication Data

US 2014/0218064 A1    Aug. 7, 2014

Related U.S. Application Data

(60) Provisional application No. 61/759,987, filed on Feb. 1, 2013.

(51) Int. Cl.
*G01R 31/26*      (2014.01)

(52) U.S. Cl.
CPC ........ *G01R 31/2601* (2013.01); *G01R 31/2607* (2013.01); *G01R 31/2612* (2013.01)

(58) Field of Classification Search
CPC .......... G01R 31/2601; G01R 31/2607; G01R 31/2612
USPC ......... 324/709, 762.09, 76.77, 610, 543, 706, 324/725, 544.07, 72.5, 121 R, 754.02, 324/754.03, 755.02; 702/55–57
See application file for complete search history.

(56) References Cited

U.S. PATENT DOCUMENTS

| | | | |
|---|---|---|---|
| 5,493,070 A | 2/1996 | Habu | |
| 5,532,590 A * | 7/1996 | Yamanaka | G01R 33/12 324/223 |
| 6,998,869 B2 * | 2/2006 | Tanida et al. | 324/762.01 |
| 2007/0182429 A1 * | 8/2007 | Goeke | 324/754 |
| 2009/0134880 A1 * | 5/2009 | Grund | G01R 31/002 324/537 |
| 2010/0127714 A1 * | 5/2010 | Negishi et al. | 324/613 |

* cited by examiner

*Primary Examiner* — Melissa Koval  
*Assistant Examiner* — Felicia Farrow  
(74) *Attorney, Agent, or Firm* — Marger Johnson; Thomas F. Lenihan

(57) ABSTRACT

An RF testing method and system by which a DC measurement pathway can also act like a properly terminated RF pathway. Achieving this requires that the output HI, LO, and Sense HI conductors are terminated in a frequency selective manner such that the terminations do not affect the SMU DC measurements. Once all SMU input/output impedances are controlled, as well as properly terminated to eliminate reflections, the high-speed devices will no longer oscillate during device testing, so long as the instruments maintain a high isolation from instrument-to-instrument (separate instruments are used on the gate and drain, or on the input and output of the device). The output of HI, LO and Sense HI conductors are coupled to various nodes of the DUT via three triaxial cables, the outer shieldings of which are coupled to each other and to an SMU ground.

15 Claims, 2 Drawing Sheets

SMU RF TRANSISTOR STABILITY ARRANGEMENT

CROSS-REFERENCE TO RELATED APPLICATIONS

This application claims the benefit of U.S. provisional patent application Ser. No. 61/759,987, filed Feb. 1, 2013, herein incorporated by reference.

BACKGROUND

The present disclosure relates generally to the field of Radio-Frequency (RF) transistors. In particular, a system employed to provide increased stability in the testing and measurement of RF transistors are described.

Design requirements to keep RF transistors and other amplifiers and three-terminal discrete devices stable are usually in conflict with the needs of a Source Management Unit (SMU) when conducting DC measurements on these devices. In particular, DC testing of such RF devices tends to cause the RF device to break into oscillation. As a result, many RF devices simply could not be DC tested. Thus, there exists a need for a method of testing RF transistors that improve upon and advance the design of known methodologies for testing these components. Examples of new and useful systems relevant to the needs existing in the field are discussed below.

In this regard, SMU's are often used to test high-speed devices (speeds greater than 1 Mhz) such as, transistors and integrated circuit amplifiers. DC I/V (current/voltage) curves of transistors and IDDQ measurements of RF amplifiers are common tests conducted on these devices. The symbol IDDQ has two meanings. IDDQ is commonly used to refer to the quiescent supply current and may also be used to refer to a test methodology that is based on taking quiescent supply current (IDDQ) measurements. Thus, IDDQ as testing methodology is one based on measuring the quiescent supply current of a device-under-test (DUT).

Each of these devices has one thing in common, gain, which mandates that some special care be taken when using or testing these devices. As is well-known in the art, any device with gain has the potential to oscillate if the output is allowed to couple back to the input with zero phase while the amplifier gain is greater than one. When these high-speed amplifiers are used in their intended application, care must be taken so that the output does not couple back to the input with a phase-aligning delay. Further, in the case of very high-speed amplifiers, additional care must be taken to ensure that the input and output lines of these devices are properly terminated to eliminate reflections. Reflections from the amplifier output can couple to the amplifier input, causing the amplifier to oscillate. In this case, a reflection could couple energy from the output of the amplifier to the input of the amplifier, generating a zero phase condition, as previously described above.

Previous high-speed devices such as transistors and amplifiers were typically connected to SMU's with long banana or triaxial cables. In each case, the long cables (transmission lines) were not properly terminated nor did they have the correct RF impedance to eliminate unwanted oscillations. As a result, many high-speed devices would oscillate when basic I/V measurements were attempted in the manner described above.

These triaxial cables, often referred to as a triax cables for short, are a type of electrical cable similar to a coaxial cable (coax for short), but with the addition of an extra layer of insulation and a second conducting sheath. Thus, the triax cables provide greater bandwidth and rejection of interference than the coax cable. Ideally, triax cables exhibit an impedance of about 100 ohms from the inner conductor to the outer shell.

Previously known methods and systems to abate such unwanted isolations called for the inner shielding of the triax cables to provide a "guard" for the Hi and Sense Hi input connections to the SMU. The guard frequency is rolled-off far below the SMU loop closure to prevent the SMU from oscillating due to the unwanted condition described above, referred to as a "guard-ring oscillator." The split guard above is accomplished by driving a cable guard with a resistor. The resistive guard will roll-off with a frequency allowing the guard to "float" at high frequencies. As a result, this inner shielding, or "guard conductor" in the triax cables will assume an appropriate RF voltage in accordance with its position between the inner and outer shielding of the triax cables for all frequencies well above the guard roll-off frequency.

Accordingly, improvements directed towards testing high-speed RF devices that reduce or eliminate unwanted oscillations are desirable.

SUMMARY

Embodiments of the disclosed technology generally include RF testing systems by which a DC measurement pathway can also act like a properly terminated RF pathway. Achieving this goal requires that the output HI, LO, and Sense HI conductors be terminated in a frequency selective manner such that the terminations do not affect the SMU DC measurements. Once all SMU input/output impedances are controlled, as well as properly terminated to eliminate reflections, the high-speed devices will no longer oscillate during device testing, so long as the instruments maintain a high isolation from instrument-to-instrument (separate instruments are used on the gate and drain, or on the input and output of the device).

The foregoing and other objects, features, and advantages of the invention will become more readily apparent from the following detailed description, which proceeds with reference to the drawings.

DETAILED DESCRIPTION

The disclosed RF testing methodologies will become better understood through review of the following detailed description in conjunction with the figures. The detailed description and figures provide merely examples of the various inventions described herein. Those skilled in the art will understand that the disclosed examples may be varied, modified, and altered without departing from the scope of the inventions described herein. Many variations are contemplated for different applications and design considerations; however, for the sake of brevity, each and every contemplated variation is not individually described in the following detailed description.

Throughout the following detailed description, examples of various RF testing methodologies are provided. Related features in the examples may be identical, similar, or dissimilar in different examples. For the sake of brevity, related features will not be redundantly explained in each example. Instead, the use of related feature names will cue the reader that the feature with a related feature name may be similar to the related feature in an example explained previously. Features specific to a given example will be described in that particular example. The reader should understand that a given feature need not be the same or similar to the specific portrayal of a related feature in any given figure or example.

Figure 1:
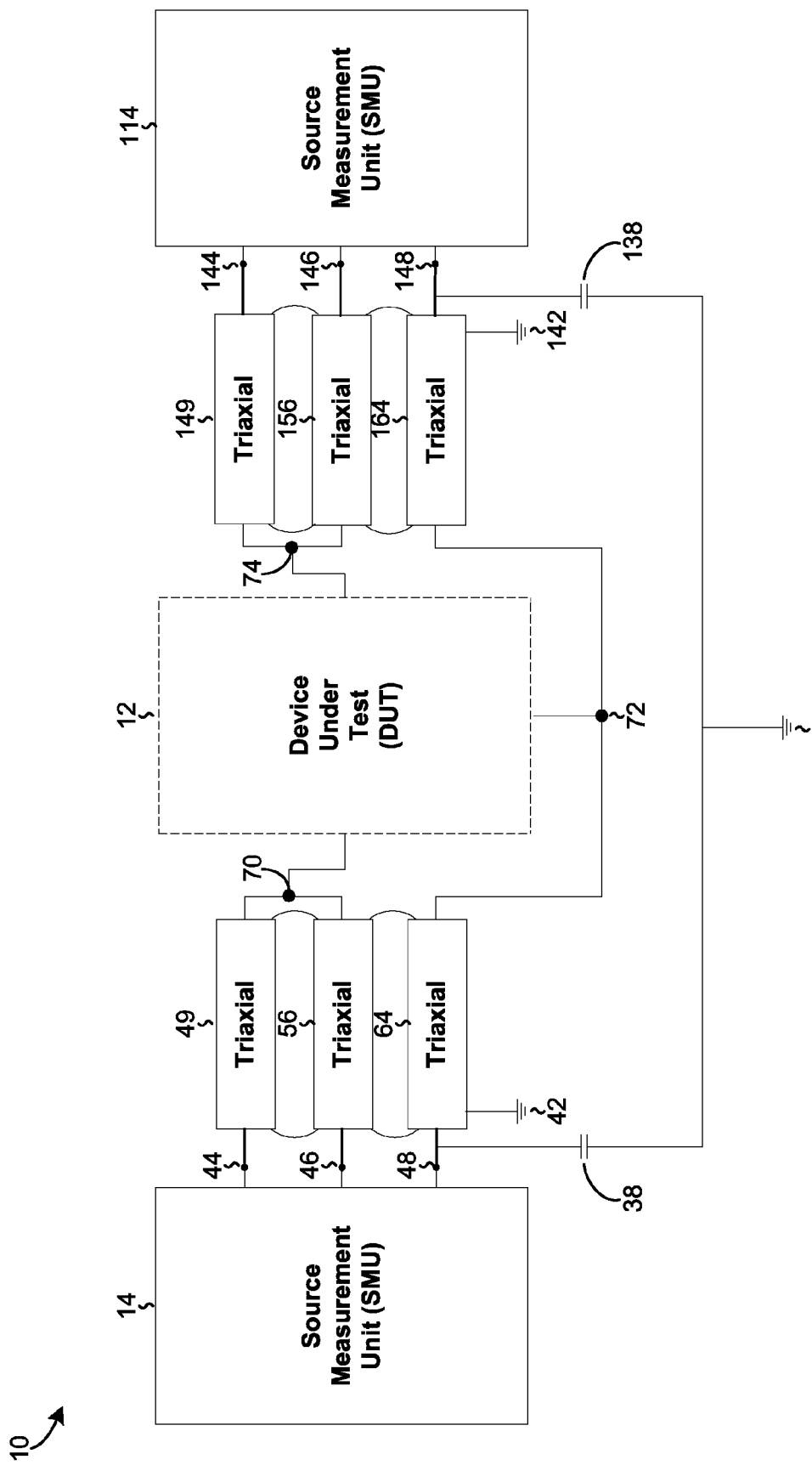
FIG. 1 is a block diagram view of a first embodiment of an SMU RF transistor stability arrangement in accordance with certain embodiments of the disclosed technology.

With reference to FIG. 1, a block diagram of a first example of a SMU RF transistor stability arrangement system and methodology 10 will now be described. System 10 includes a device-under-test (DUT) 12, a first SMU 14 having a first set of at least three test points 44, 46, 48, a first set of triaxial cables 49, 56, 64, a set of nodes 70, 72, 74 connected to DUT 12, a second SMU 114 having a second set of at least three test points 144, 146, 148, and a second set of triaxial cables 149, 156, 164.

Figure 2:
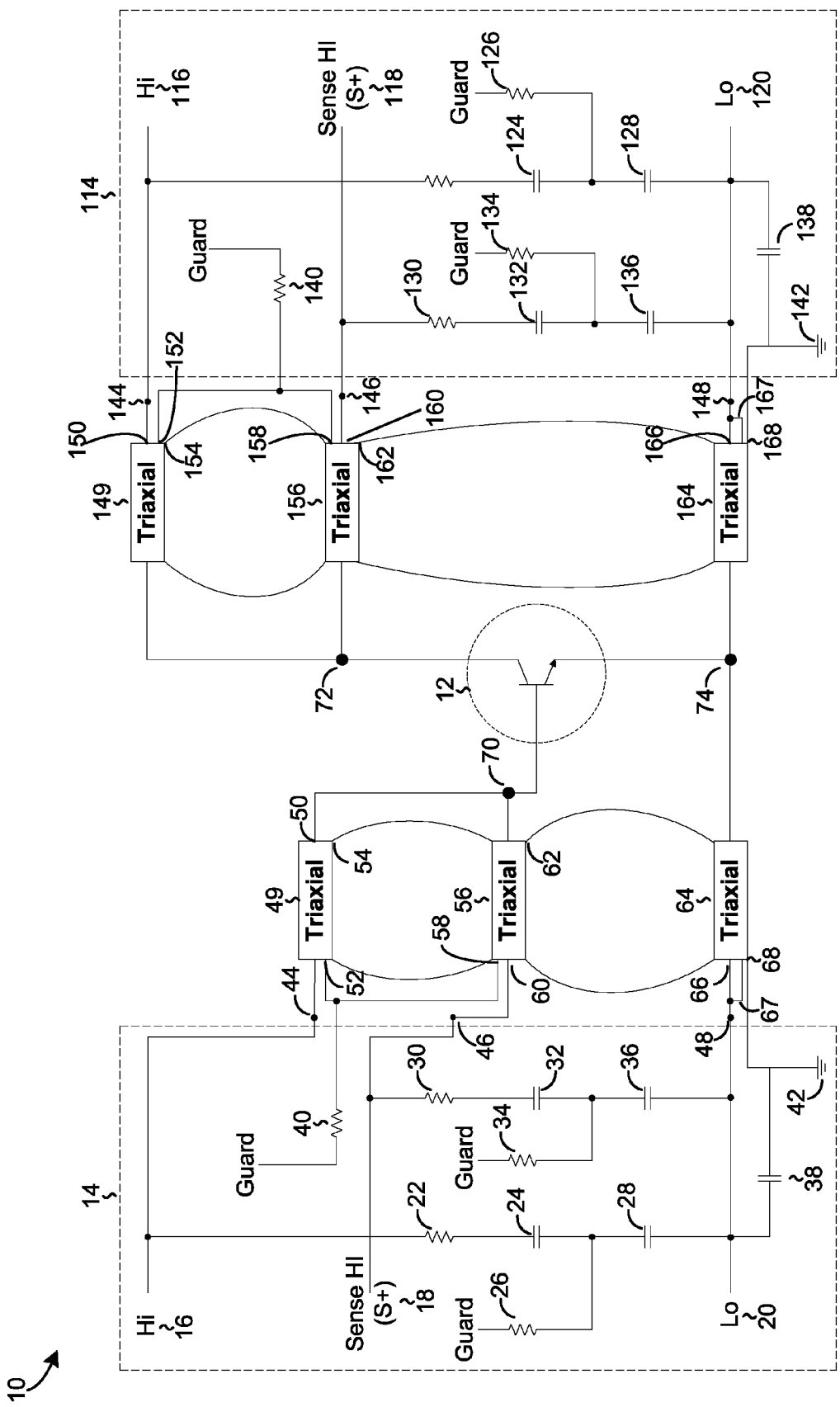
FIG. 2 is a schematic diagram of an example of the SMU RF transistor stability arrangement illustrated in FIG. 1.

As shown in FIG. 2, each of the first set of triaxial cables 49, 56, 64 includes at least a center signal conductor 50, 60, 66, an outer shielding 54, 62, 68, and a middle conductor 52, 58, 67, respectively. Similarly, each of the second set of triaxial cables 149, 156, 164 includes at least a center signal conductor 150, 160, 166, an outer shielding 154, 162, 168, and a middle conductor 152, 158, 167, respectively. System 10 functions to provide a cable interconnection methodology that allows for measurement of the I/V characteristics of an RF DUT with reduced interference between the inputs and outputs of the SMU.

In the example shown in FIG. 2, SMU 114 is configured identically to SMU 14; thus, method and system 10 need be described with respect to SMU 14 only and its connection to triax cables 49, 56, 64. For ease of understanding and when referencing between SMU 14 and SMU 114, each of the mirrored components for SMU 114 have been labeled with the corresponding SMU 14 label increased by 100, (e.g., SMU 14 is identical to SMU 114, first guard resistor 26 is identical to first guard resistor 126, etc). Values for each of the resistors and capacitors described will be given parenthetically, but the reader will appreciate that those values are but just one example of a set of values for the given components. Accordingly, other examples of system 10 may include many other sets of values for each of the resistors and capacitors described herein. Further, DUT 12 is shown in the present example as a bi-polar transistor, but may be any three-terminal device in other system examples.

As can be seen in FIG. 2, SMU 14 further includes a HI input terminal 16, a Sense HI input terminal 18, and a LO input terminal 20. HI input terminal 16 is RF terminated above a CUTOFF frequency by providing a first termination resistor 22 (50Ω) in series with a first guard capacitor 24 (50 pF) and a second guard capacitor 28 (150 pF) to the LO input terminal 20 and grounded to a terminal ground 42 through grounding capacitor 38 (100 pF). Additionally, the HI input terminal 16 is also electrically coupled to triax cable 49 through test point 44. It should be noted that it is the center signal conductor 50 of triax cable 49 that is electrically coupled with the HI input terminal 16. The center signal conductor 50 of triax cable 49 is also electrically coupled to the base of DUT 12 through node 70.

Similarly, the Sense HI (S+) input terminal 18 is RF terminated above the CUTOFF frequency by providing a second termination resistor 30 (50Ω) in series with a third guard capacitor 32 (50 pF) and a fourth guard capacitor 36 (150 pF) to the LO input terminal 20 and grounded to the terminal ground 42 through the grounding capacitor 38 (100 pF). Additionally, the Sense HI terminal 18 is also electrically coupled to triax cable 56 through test point 46. It should be noted that it is the center signal conductor 60 of triax cable 56 that is electrically coupled with Sense HI terminal input 18. The center signal conductor 60 of triax cable 56 is also electrically coupled to the base of DUT 12 through node 70.

Both the first termination resistor 22 and the second termination resistor 30 and one of its respective guard capacitors 24, 32 are "guarded out" with its respective guard resistor 26, 34 for all frequencies below the CUTOFF frequency. Guard resistors 26, 34 and all guard capacitors 24, 28, 32, 36 are designed so that the DC guard works only below the CUTOFF frequency, leaving HI input terminal 16 and Sense Hi input terminal 18 properly RF terminated above the CUTOFF frequency. Further, the outer shielding 54, 62, 68 of triax cables 49, 56, 64 are electrically coupled together and earth grounded at the terminal ground 42. These connections are required to maintain proper termination for the disclosed embodiment.

LO input terminal 20 is electrically coupled to both the HI input terminal 16 and the Sense HI input terminal 18 as previously stated, as well as electrically coupled to center signal conductor 66 of triaxial cable 64. Further, middle conductor 67 of triax cable 64 is also electrically coupled to the LO input terminal 20, while the center signal conductor 66 of triax cable 64 is electrically coupled to an emitter of DUT 12 through node 74, which also is electrically coupled to the center signal conductor 166 of triax cable 164.

A third guard resistor 40 (20 KΩ) is electrically coupled to triax 49 and triax 56 through their respective middle conductors 52, 58. Guard resistor 40 functions in the same manner as guard resistors 26, 34, which is to utilize an op amp at each of the three guard input terminals (op amp circuitry not shown) to look at whatever voltage is on the HI input terminal 16 and the Sense HI input terminal 18, respectively, and to put those same voltages at those respective guard input terminals. Thus, for instance, at a frequency below the CUTOFF frequency, the DC guard is in effect; however, for frequencies above the CUTOFF frequency, the DC guard will fail, and both the HI input terminal 16 and Sense HI input terminal 18 will properly terminated to the ground terminal 42.

It should be noted that system 10 is suitable for I/V measurements (frequencies below the CUTOFF frequency) and for RF measurements (frequencies above the CUTOFF frequency) as explained above. While the CUTOFF frequency for each SMU may vary because of the values for the internal components, the optimum value for the CUTOFF frequency partially depends on the measurement bandwidth as well as the RF frequency required for the DUT to be properly terminated and stabilized. However, as a general rule, the CUTOFF frequency should be designed to be as low as possible, which is typically just above the measurement bandwidth. For high resolution I/V measurements, it would not be uncommon for the frequency CUTOFF to be between 3 Khz and 6 Khz, just above the I/V measurement. For example, in the present disclosed embodiment, the CUTOFF frequency is about 3,538 Hz, which is a frequency that is below where most of the I/V measurements are made. Alternatively, other methods may have the CUTOFF frequency within the previously disclosed range of 3-6 Khz.

As illustrated in FIG. 2, the present embodiment discloses the interconnection of the DUT 12 in a common-emitter configuration, where the emitter of the DUT 12 is common to the ground terminal 42 through the central signal conductor 66 of triaxial cable 64 and grounding capacitor 38. Alternatively, in other examples, the DUT could be interconnected with a common-base or common-collector configuration. Further, the DUT in the present embodiment happens to be an NPN transistor, but in other examples, the DUT may be a metal oxide semiconductor field effect transistor (MOSFET), an operational amplifier, or any three-terminal discrete device.

Having described and illustrated the principles of the invention with reference to illustrated embodiments, it will be recognized that the illustrated embodiments may be modified in arrangement and detail without departing from such principles, and may be combined in any desired manner. And although the foregoing discussion has focused on particular embodiments, other configurations are contemplated. In particular, even though expressions such as "according to an embodiment of the invention" or the like are used herein, these phrases are meant to generally reference embodiment possibilities, and are not intended to limit the invention to particular embodiment configurations. As used herein, these terms may reference the same or different embodiments that are combinable into other embodiments.

Consequently, in view of the wide variety of permutations to the embodiments described herein, this detailed description and accompanying material is intended to be illustrative only, and should not be taken as limiting the scope of the invention. What is claimed as the invention, therefore, is all such modifications as may come within the scope and spirit of the following claims and equivalents thereto.

I claim:

1. A method for testing a device under test (DUT), comprising:
  connecting a first Source Measurement Unit (SMU) including at least three test points to a first set of at least three triaxial cables, each triaxial cable having at least a center signal conductor, an outer shielding, a middle conductor, and a ground terminal so that each of the three test points is connected to a first end of the center signal conductor of each of the first set of the three triaxial cables, respectively, and where each of the outer shieldings of the first set of triaxial cables is electrically coupled together along with the ground terminal;
  connecting a second end of each of the first set of triaxial cables to a set of nodes of the device under test;
  connecting a second SMU including at least three test points to a second set of at least three triaxial cables and having a center signal conductor, outer shielding, a middle conductor, and a ground terminal so that each of the three test points is connected to a first end of the center signal conductor of each of the second set of the three triaxial cables, respectively, and where each of the outer shieldings of the second set of triaxial cables is electrically coupled together along with the ground terminal; and
  connecting a second end of each of the second set of triaxial cables to the set of nodes of the device under test, wherein the outer shielding of both the first and second set of triaxial cables are electronically coupled together and electrically coupled to their respective ground terminals, and wherein the first and second SMU further include:
    a first input terminal electrically coupled to the first test point, the first input terminal having:
      a first termination resistor electrically coupled in series with the first input terminal;
      a first and a second guard capacitor electrically coupled in series with the first termination resistor;
      a first guard resistor electrically coupled with the first guard capacitor and the second guard capacitor;
      a grounding capacitor electrically coupled in series with its respective ground terminal;
    a second input terminal electrically coupled to the second test point, the second input terminal having:
      a second termination resistor electrically coupled in series with the second input terminal;
      a third and fourth guard capacitor electrically coupled in series with the second termination resistor;
      a second guard resistor electrically coupled with the third guard capacitor and the fourth guard capacitor; and
    a third input terminal electrically coupled to the first input terminal, the second input terminal, and the third test point, and where the third input terminal is also electrically coupled to the grounding capacitor and its respective ground terminal.

2. The method of claim 1, wherein the first and second SMU each include a chassis ground terminal to which the respective outer shieldings of the first and second set of triaxial cables are electrically coupled.

3. The method of claim 1, wherein the first input terminal is configured to receive a Hi signal input.

4. The method of claim 1, wherein the second input terminal is configured to receive a Sense Hi signal input.

5. The method of claim 1, wherein the third input terminal is configured to receive a Lo signal input.

6. The method of claim 1, wherein the DUT is a metal oxide semiconductor field effect transistor (MOSFET) or an operational amplifier or a three-terminal discrete device.

7. The method of claim 1, wherein the DUT is electrically coupled to the first and second set of triaxial cables in a common-emitter configuration.

8. The method of claim 1, wherein the DUT is electrically coupled to the first and second set of triaxial cables in a common-base configuration.

9. The method of claim 1, wherein the DUT is electrically coupled to the first and second set of triaxial cables in a common-collector configuration.

10. The method of claim 1, wherein the first and second SMU each having a respective first input electrically coupled to a first test point, each SMU having a respective first input terminal electrically coupled with a first termination resistor, each SMU's terminal resistor having a resistance of at least 50 ohms.

11. The method of claim 1, wherein the first and second set of triaxial cables have an impedance of at least 100 ohms.

12. The method of claim 1, wherein each SMU further includes a third guard resistor electrically coupled to the middle conductors of the first and second triaxial cables, respectively.

13. A system for testing a device under test (DUT), comprising:
  a first Source Measurement Unit (SMU) including at least three test points connected to a first set of at least three triaxial cables, each cable having at least a center signal conductor, an outer shielding, a middle conductor, and a first ground terminal so that each of the three test points is connected to a first end of the center signal conductor of each of the first set of the three triaxial cables, respectively, and where each of the outer shieldings of the first set of triaxial cables is electrically coupled together and to the first ground terminal;
  a set of nodes, the set of nodes connected to a second end of each of the first set of triaxial cables and to the DUT;
  a second SMU including at least three test points connected to a second set of at least three triaxial cables, each cable having at least a center signal conductor, an outer shielding, a middle conductor, and a second ground terminal so that each of the three test points is connected to a first end of the center signal conductor of each of the second set of the three triaxial cables, respectively, and where each of the outer shieldings of the second set of triaxial cables is electrically coupled together and to the second ground terminal; and a second end of each of the second set of triaxial cables connected to the set of nodes and to the DUT;

wherein the outer shieldings of both the first and second set of triaxial cables are electronically coupled to their respective first and second ground terminals; and wherein the first and second SMU further include:
    a first input terminal electrically coupled to the first test point, the first input terminal having:
        a first termination resistor electrically coupled in series with the first input terminal;
        a first and a second guard capacitor electrically coupled in series with the first termination resistor;
        a first guard resistor electrically coupled with the first guard capacitor and the second guard capacitor;
    a grounding capacitor electrically coupled in series with its respective ground terminal;
    a second input terminal electrically coupled to the second test point, the second input terminal having:
        a second termination resistor electrically coupled in series with the second input terminal;
        a third and fourth guard capacitor electrically coupled in series with the second termination resistor;
        a second guard resistor electrically coupled with the third guard capacitor and the fourth guard capacitor; and
    a third input terminal electrically coupled to the first input terminal, the second input terminal, and the third test point, and where the third input terminal is also electrically coupled to the grounding capacitor and its respective ground terminal.

14. The system of claim 13, wherein the first and second SMU each include a chassis ground terminal to which the respective outer shieldings of the first and second triaxial cables are electrically coupled.

15. The system of claim 13, wherein the DUT is a metal oxide semiconductor field effect transistor (MOSFET), or an operational amplifier, or a three-terminal discrete device.

* * * * *